(12) United States Patent
Tong et al.

(10) Patent No.: US 10,777,899 B2
(45) Date of Patent: Sep. 15, 2020

(54) TRANSMISSION LINE COUPLING SYSTEM

(71) Applicant: NXP USA, INC., Austin, TX (US)

(72) Inventors: Ziqiang Tong, Ottobrunn (DE); Ernst Seler, Munich (DE); Shamsuddin Ahmed, Munich (DE)

(73) Assignee: NXP USA, INC., Austin, TX (US)

( * ) Notice: Subject to any disclaimer, the term of this patent is extended or adjusted under 35 U.S.C. 154(b) by 39 days.

(21) Appl. No.: 16/117,516

(22) Filed: Aug. 30, 2018

(65) Prior Publication Data
US 2019/0109382 A1    Apr. 11, 2019

(30) Foreign Application Priority Data

Oct. 6, 2017   (EP) ..................... 17195317

(51) Int. Cl.
| | | |
|---|---|---|
| *H01Q 13/08* | (2006.01) |
| *H01Q 1/32* | (2006.01) |
| *H01P 3/08* | (2006.01) |
| *H05K 1/02* | (2006.01) |
| *H01P 5/02* | (2006.01) |
| *H01P 5/107* | (2006.01) |

(52) U.S. Cl.
CPC ............... *H01Q 13/08* (2013.01); *H01P 3/08* (2013.01); *H01P 5/02* (2013.01); *H01P 5/107* (2013.01); *H01Q 1/3233* (2013.01); *H05K 1/0243* (2013.01); *H05K 2201/10098* (2013.01)

(58) Field of Classification Search
CPC .. H01Q 13/08; H01Q 1/32; H01P 3/08; H01P 5/02; H01P 5/10; H05K 1/02
USPC ........................................................ 343/905
See application file for complete search history.

(56) References Cited

U.S. PATENT DOCUMENTS

| | | |
|---|---|---|
| 5,311,153 A | 5/1994 | Lau et al. |
| 9,178,260 B2 | 11/2015 | Biglarbegian et al. |
| 2017/0222323 A1* | 8/2017 | Brown ............... H01Q 1/3233 |
| 2017/0271738 A1* | 9/2017 | Smith, Jr. ............. H01P 5/024 |

FOREIGN PATENT DOCUMENTS

| | | |
|---|---|---|
| DE | 102006019054 A1 | 10/2007 |
| DE | 102010034525 A1 | 2/2011 |

OTHER PUBLICATIONS

Tong, Z., "A Millimeter-wave Transition from Microstrip to Waveguide Using a Differential Microstrip Antenna", Proceedings of the 40th European Microwave Conference, pp. 660-663, EuMA 2010.

* cited by examiner

*Primary Examiner* — Andrea Lindgren Baltzell

(57) ABSTRACT

A transmission line coupling arrangement comprising:
a substrate comprising:
a plurality of transmission lines each having a terminal radiating end for providing an electromagnetic wave as a result of a signal provided to the transmission line; and
a footprint region extending over a portion of the substrate,
wherein each of the terminal radiating ends of each of the plurality of transmission lines extend to a respective point within the footprint region; and
the footprint region configured to receive a single transition housing thereover, the transition housing having at least one waveguide for receipt of the electromagnetic wave from one of the terminal radiating ends for coupling the at least one of the plurality of transmission lines to one of an output waveguide and an output antenna.

20 Claims, 4 Drawing Sheets

TRANSMISSION LINE COUPLING SYSTEM

CROSS-REFERENCE TO RELATED APPLICATIONS

This application claims the priority under 35 U.S.C. § 119 of European Patent application no. 17195317.7, filed on 6 Oct. 2017, the contents of which are incorporated by reference herein.

The present disclosure relates to a transmission line coupling arrangement, a transition housing and a transmission line coupling system comprising said transmission line coupling arrangement and the transition housing. It also relates to an electronic device comprising said transmission line coupling system.

According to a first aspect of the present disclosure there is provided a transmission line coupling arrangement comprising: a substrate comprising: a plurality of transmission lines each having a terminal radiating end for providing an electromagnetic wave as a result of a signal provided to the transmission line; and a footprint region extending over a portion of the substrate, wherein each of the terminal radiating ends of each of the plurality of transmission lines extends to a respective point within the footprint region; and the footprint region configured to receive a single transition housing thereover, the transition housing having at least one waveguide for receipt of the electromagnetic wave from one of the terminal radiating ends for coupling the at least one of the plurality of transmission lines to one of an output waveguide and an output antenna.

In one or more embodiments, the transmission line coupling arrangement may further comprise a signal generator configured to provide signals to one or more of the plurality of transmission lines, the transmission lines extending substantially parallel to each other over at least a majority of their length.

In one or more embodiments, the plurality of transmission lines may extend substantially parallel to each other continuously from the radiating ends over at least a majority of their length.

In one or more embodiments, the terminating ends may terminate at collinear spaced positions within the footprint region.

In one or more embodiments, the substrate may include one or more spacing apertures, the one or more spacing apertures may extend at least between two of the terminal radiating ends of the plurality of transmission lines.

In one or more embodiments, a plurality of the spacing apertures substantially surround the at least one terminal radiating end on each side not in communication with its respective transmission line. In one or more embodiments, a plurality of spacing apertures may substantially surround each of the terminal radiating ends on each side not in communication with the respective transmission lines.

In one or more embodiments, the terminal radiating end may comprise an antenna.

In one or more embodiments, the terminal radiating end may comprise a first metal portion and a second metal portion spaced therefrom, the first and second metal portions forming a differential antenna.

In one or more embodiments, the footprint region may comprise at least one substrate fixing for alignment and coupling to a corresponding footprint portion fixing of the single transition housing to retain the transition housing on the substrate.

In one or more embodiments, the plurality of transmission lines may be a plurality of microstrip transmission lines. In one or more embodiments, the plurality of transmission lines may comprise a plurality of stripline transmission lines. In one or more embodiments, the plurality of transmission lines may comprise a plurality of coplanar waveguide transmission lines. In one or more embodiments, the plurality of transmission lines may comprise a plurality of slotline transmission lines. In one or more embodiments, the plurality of transmission lines may comprise any combination of: a microstrip transmission line, a stripline transmission line, a coplanar transmission line; or a slotline transmission line.

In one or more embodiments, the substrate may be a printed circuit board.

In one or more embodiments, the plurality of transmission lines may comprise three transmission lines. In one or more embodiments, the plurality of transmission lines may comprise four, five, seven or more than ten transmission lines.

According to a second aspect of the present disclosure there is provided a transition housing for receipt over a footprint region of a substrate, the transition housing comprising: an output coupling portion couplable to an output antenna or an output waveguide; a plurality of input coupling portions couplable to a corresponding plurality of terminal radiating ends of a plurality of transmission lines on a substrate; and a routing waveguide for routing an electromagnetic wave between one of the plurality of input coupling portions and the output coupling portion.

In one or more embodiments, the transition housing may comprise a first surface for abutment and connection to the footprint region and comprising the plurality of input coupling portions; and a second surface comprising the output coupling portion, wherein the first surface is opposite the second surface.

In one or more embodiments, the first surface may comprise a first surface area and the second surface comprises a second surface area and wherein the first surface area is smaller than the second surface area.

In one or more embodiments, the transition housing may comprise at least one transition housing footprint portion fixing for alignment and coupling to a corresponding substrate fixing of the substrate to retain the housing on the substrate.

In one or more embodiments, the shape of the first surface may be different than the shape of the second surface.

In one or more embodiments, the transition housing may comprise a plurality of output coupling portions and a plurality of routing waveguides, each of the plurality of routing waveguides associated with a corresponding input coupling portion and output coupling portion to provide routing of electromagnetic waves therebetween.

In one or more embodiments, the second surface may comprise head portion fixings for coupling the output coupling portion to a WR10 waveguide. In one or more embodiments, the second surface may comprise head portion fixings for coupling a plurality of output couplings to a corresponding plurality of output waveguides. In one or more embodiments, the second surface may comprise head portion fixings for coupling the output coupling portion or one of a plurality of output coupling portions to a waveguide splitter. In one or more embodiments, the second surface may comprise fixings for coupling the output coupling portion or the plurality of output couplings to one or more output antennas.

According to a third aspect of the present disclosure there is provided a transmission line coupling system comprising: the transmission line coupling arrangement of the first aspect; and the transition housing of the second aspect, the transition housing received over the footprint region, and each of the plurality of input coupling portions coupled to each of the corresponding plurality of terminal radiating ends of each of the plurality of transmission lines.

According to a fourth aspect of the present disclosure there is provided an electronic device comprising the transmission line coupling system of the third aspect.

In one or more embodiments, the electronic device may comprise: an automotive radar system; a mobile communications device; a navigation device; a power meter; a remote control for a wireless device; and a magnetic resonance spectrometer.

In one or more embodiments of the present disclosure there is provided a method of connecting a plurality of transmission lines to a plurality of respective output waveguides or output antennas comprising: providing the transmission line coupling arrangement of the first aspect; coupling the transition housing of the second aspect over the footprint region of the substrate, the transition housing having a plurality of coupling portions; and coupling a plurality of output waveguides or output antennas to the plurality of output coupling portions.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 6:
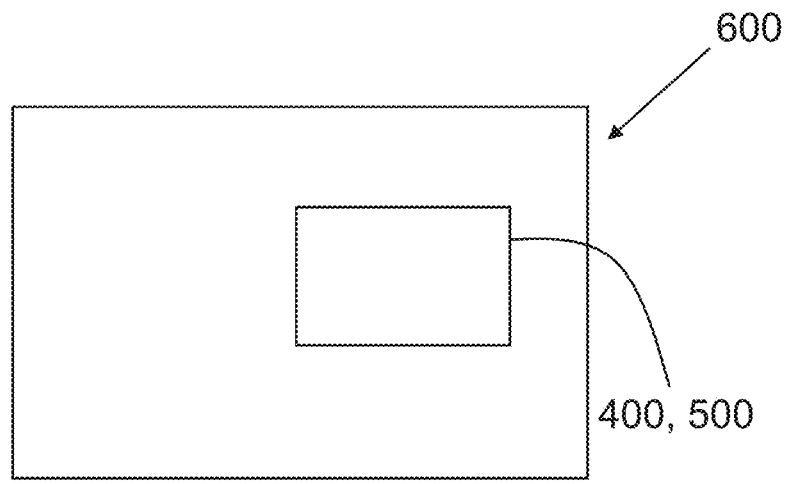
Figure 7:
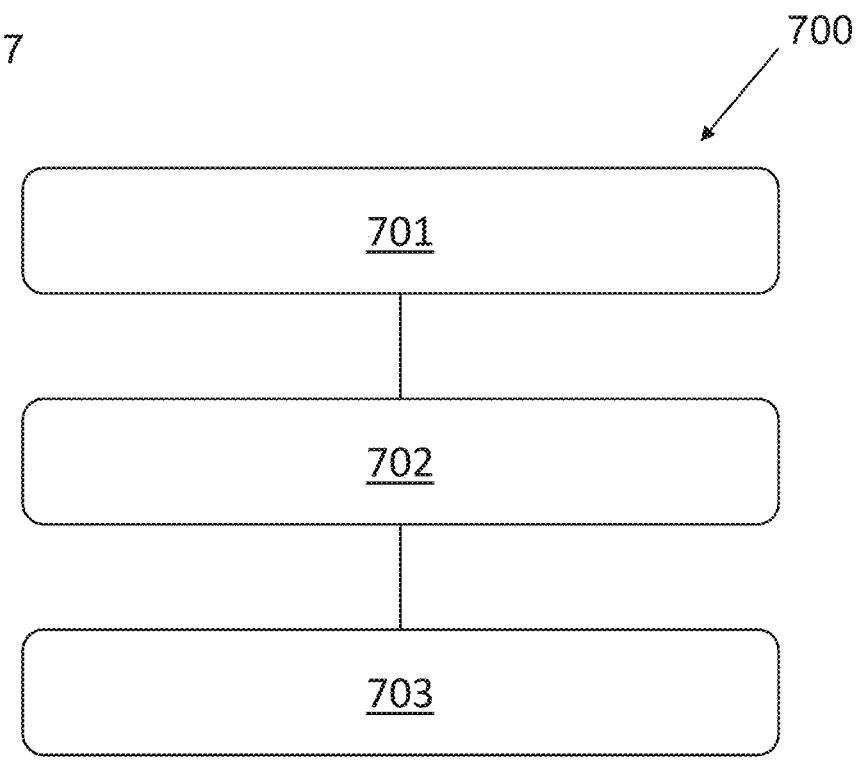

FIG. 6 shows an example embodiment of an electronic device comprising the transmission line coupling system; and FIG. 7 shows an example method of connecting a plurality of transmission lines to a plurality of respective output waveguides or output antennas There is a continuing demand in the field of electronics to produce smaller and smaller electronic devices. Many approaches are being used in order to drive the continual improvement required by the industry such as reducing the size of existing components, reducing spacing between components and reducing the number of components required in order to provide the same or better results. Electronic devices utilising microwaves in order to operate are no exception to this rule, however, the dimensions of many components for carrying or coupling electromagnetic waves are limited by the physics of wave propagation in a waveguide or transmission line.

Transmission lines can be used for routing signals from a signal generator to an antenna for the generation of an electromagnetic signal to free space. Routing of an electromagnetic wave from a signal generator or other circuit to an output component can be provided by a transition housing which provides a waveguide for routing the electromagnetic wave between the transmission line on a substrate such as a PCB and an output antenna. Alternatively, the transition housing may route the electromagnetic wave between the transmission line on the PCB to an output waveguide, such as a waveguide which can direct the electronic wave to a desired device. The transition housing may route to one or more of an antenna, a radar module, a horn antenna, a slotted waveguide, a signal processing module, a harmonic mixer or any other device.

Figure 1:
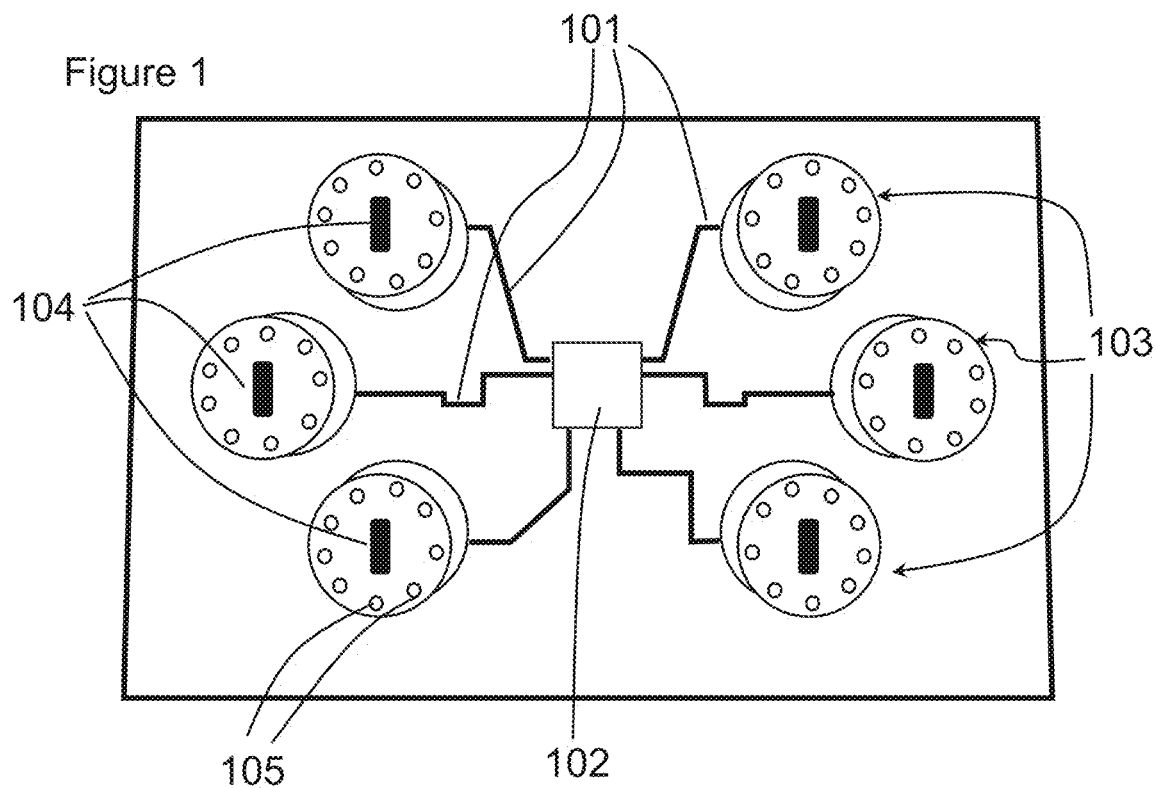
FIG. 1 shows an example prior art circuit comprising a plurality of transmission lines and a plurality of transition housings.

FIG. 1 shows an example of a circuit not within the scope of the claims comprising a plurality of transmission lines 101 extending from a signal generator 102 to a plurality of separate transition housings 103. Each of the transition housings 103 are configured to couple a respective one of the transmission lines 101 to a standard output waveguide at their upper surface through an output coupling portion 104. The output waveguide may be connected to the upper surface of the transition housing by way of transition housing head portion fixings 105 arranged around the outside of the upper surface.

The present disclosure provides a transition housing for coupling to a plurality of transmission lines and providing routing between at least one of the transmission lines to an output such as an output waveguide or an output antenna. An associated transmission line coupling arrangement is also disclosed. By providing a single transition housing which is couplable to a plurality of transmission lines, the area of the PCB dedicated to transition housings can be reduced in comparison to the prior art of FIG. 1, allowing for a reduction in substrate/PCB size or the integration of more electronic components onto the same size substrate/PCB.

Figure 2:
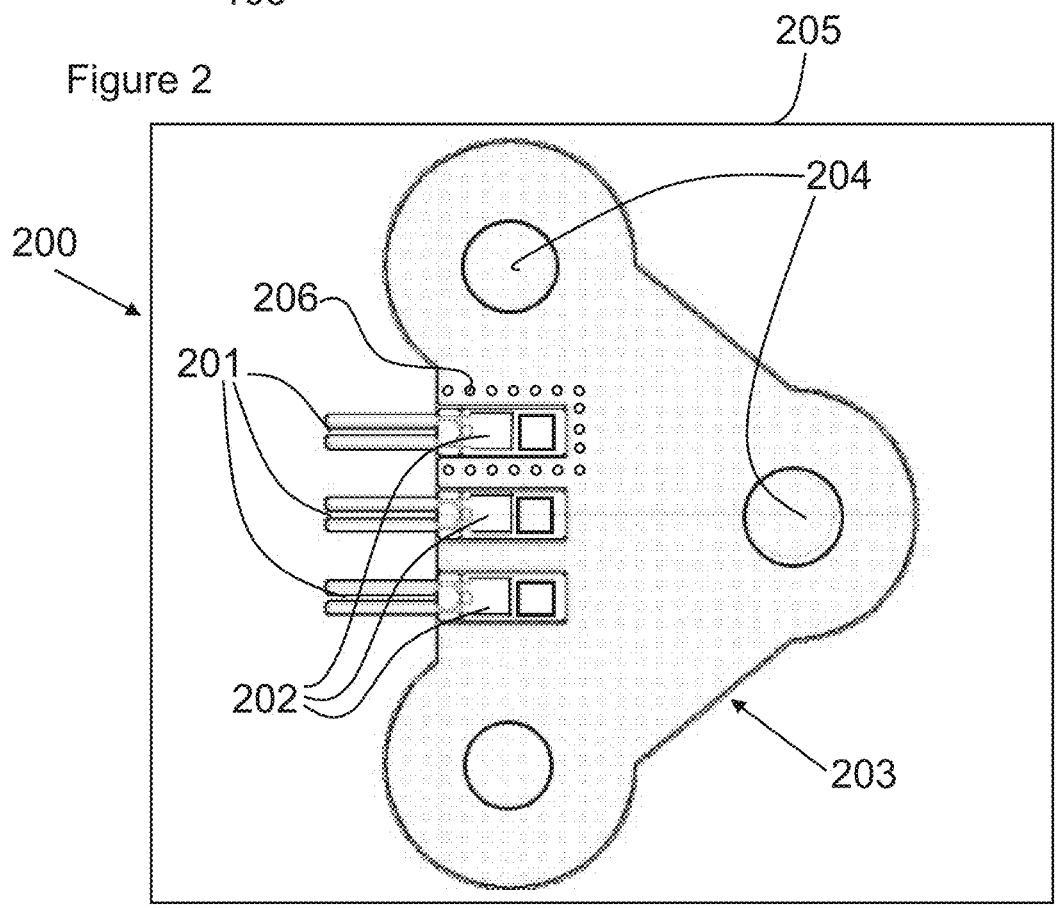
FIG. 2 shows an example embodiment of a plan view of a transmission line coupling arrangement.

FIG. 2 shows a transmission line coupling arrangement 200 comprising a substrate 205 which comprises a plurality of transmission lines 201 each having a terminal radiating end 202 for providing an electromagnetic wave as a result of a signal provided to the transmission line and a footprint region 203 extending over a portion of the substrate. In this example, the footprint region 203 comprises a portion of the substrate over which the transition housing is to be received.

The transmission lines 201 may comprise microstrip transmission lines which extend into the footprint region and terminate in a terminal radiating end. In the example of FIG. 2, the terminal radiating end 202 may comprise a first metal layer and a second metal layer, the first and second metal layers forming a differential antenna. Each of the terminal radiating ends 202 are configured to provide an electromagnetic wave when excited by a signal provided to the associated transmission line 201. It will be appreciated that transmission lines 201 may alternatively comprise stripline transmission lines, coplanar waveguide transmission lines or slotline transmission lines. It will also be appreciated that the terminal radiating ends may have different antenna configurations and as such may comprise one or more of patch antennas, differential antennas, via antennas or slot antennas.

The footprint region 203 may comprise one or more substrate fixings 204. The substrate fixings 204 may, for example, comprise apertures through which a pin or bolt may be placed in order to provide for attachment to the transition housing. In FIG. 2, three substrate fixings 204 are used, which may provide for a particularly stable mounting of a transition housing while keeping the substrate area required by the footprint 203 region low. In other embodiments, one, two or more than three substrate fixings may be used.

The transmission line coupling arrangement 200 may comprise a signal generator coupled to one or more of the transmission lines 201. The signal generator (not shown) may be coupled to an opposite end of the transmission lines to the radiating terminal ends 202. The signal generator may be configured to generate signals which are conveyed through the one or more transmission lines 201 to the radiating terminal ends 202. The transmission lines 201 may extend substantially parallel to each other for the majority of their length between the signal generator and the footprint region 203. This may be particularly advantageous to provide a substantially equal path length. The provision of the footprint region 203 which is accepting of a plurality of transmission lines may provide for substantially straight transmission line 201, such as without changes of direction above 30, 45, 60 or 90 degrees. In other examples, the length of each transmission line 201 between the signal generator and the footprint region 203 may be substantially the same. This may be particularly advantageous for maintaining coherence between the signal phases for the signals in each of the transmission lines 201 and/or reducing losses.

In some examples, one or more apertures 206 or vias (shown only around one of the terminal radiating ends, for clarity) may extend adjacent to and spaced from at least one of the terminal radiating ends 202 of the transmission lines 201, the one or more spaced apertures extending at least between two of the terminal radiating ends 202 of the plurality of transmission lines 201. In some embodiments, a plurality of apertures may be provided in the substrate around each of the terminal radiating ends 202 on each side. The apertures may be configured to reduces electromagnetic coupling between adjacent transmission lines 201.

Figure 3:
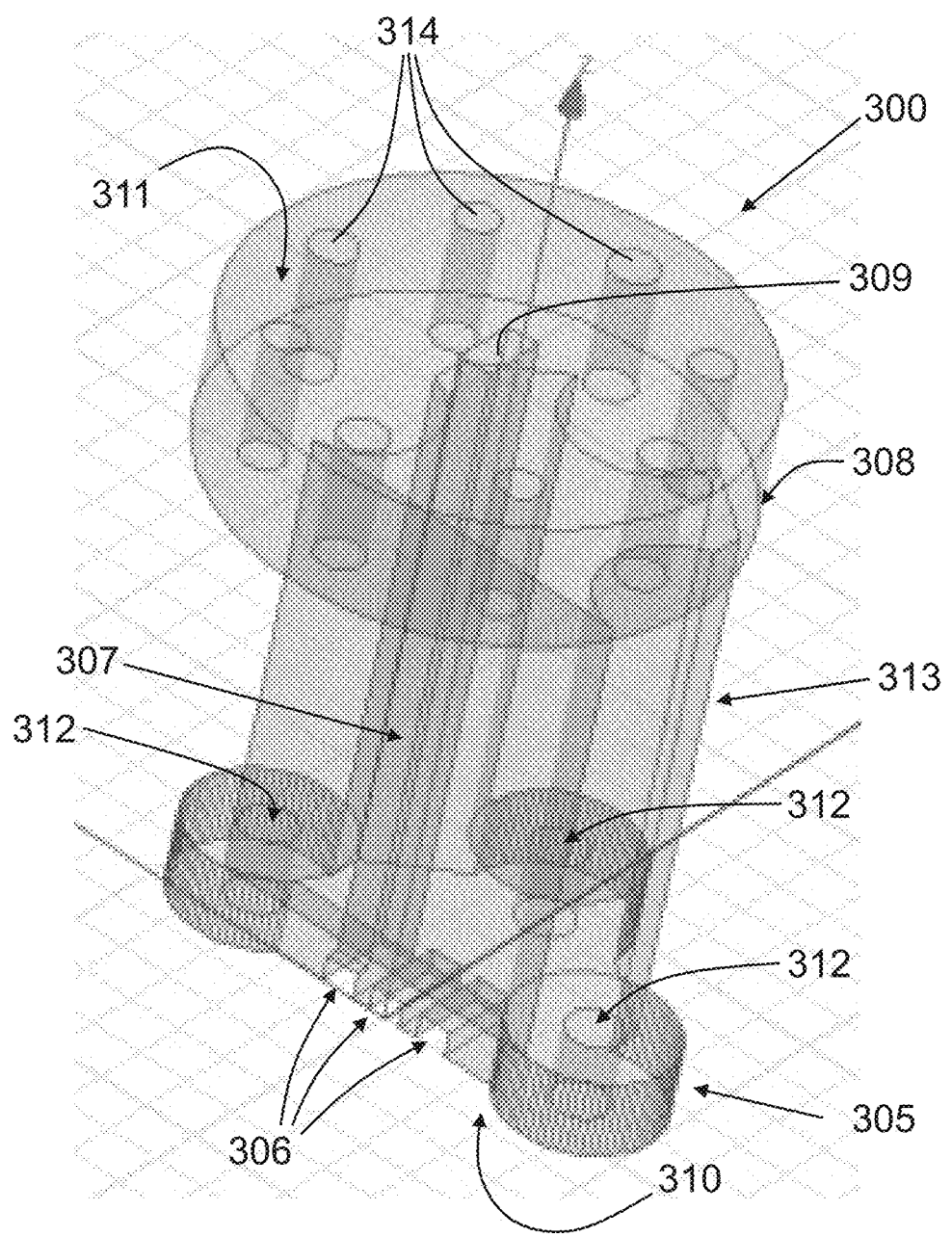
FIG. 3 shows an example embodiment of an isometric view of the transition housing.

FIG. 3 shows an isometric view of an example transition housing 300. The transition housing 300 may comprise: a footprint portion 305 for extending over and being couplable to the footprint region 203 of a substrate and comprises a plurality of input coupling portions 306; a body portion 313, which may comprise one or more routing waveguides 307; and a head portion 308 which comprises the at least one output coupling portion 309. The footprint portion 305 of the transition housing 300 comprises a first surface 310 of the transition housing 300 which is configured to abut and be connected to the substrate 205. The plurality of input coupling portions 306 may comprise grooves in the first surface 310. The plurality of input coupling portions 306 may extend at least over a portion of the first surface 310 so that the terminal end portions 202 of transmission lines 201 may be coupled therewith. The head portion 308 of the transition housing 300 comprises a second surface 311 of the transition housing 300 comprising the output coupling portion 309 which is configured to be connectable to one or more output waveguides or output antennas. The one or more routing waveguides 307 comprise channels through the transition housing configured to route an electromagnetic wave propagated from the terminal radiating end into a respective input coupling portion 309 to the respective output coupling portion 309. In the example of FIG. 3, the first surface 310 is opposite the second surface 311, however, it will be understood that the transition housing 300 may be configured such that the first surface 310 is not opposite the second surface 311. The second surface 311 may be on an edge of the transition housing 300 such that the output coupling portion 309 extends at 90 degrees or another oblique angle to the first surface 310. In some embodiments, multiple output surfaces, such as at different orientations to the first surface 310, may be provided. The output surfaces may each include one or more output coupling portions 309. One or more respective routing waveguides 307 may extend from the first surface 310 to respective output surfaces, It can be seen that, in this example, three input coupling portions 306 are provided in the base of the transition housing 300 for coupling to the terminal end portions 202 of the transmission line coupling arrangement 200. Any number of such input coupling portions 306 may be provided as necessary for the required number of terminal end portions 202.

In the example of the figure, only one of the input coupling portions 306 is further connected to an output coupling portion 309 by a routing waveguide 307. The remaining two input coupling portions 306 are not connected to routing waveguides 307 for the routing of electromagnetic waves. Thus, one or more of the input coupling portions 306 may connect to a corresponding routing waveguide 307 while the others may be blind. A transition housing 300 comprising a single output coupling portion 309 may be used, for example, in a test assembly wherein the transition housing 300 couples to a power meter for determining the power transmission characteristics of the circuit. In one or more embodiments, any number of the input coupling portions 306 may be connected to respective output coupling portions 309 by way of respective routing waveguides 307. Thus, while the transition housing 300 is configured to connect to a footprint region including a plurality of terminal radiating ends and may comprise a corresponding plurality of input coupling portions 306, one or a plurality of the input coupling portions 306 may connect to a routing waveguide 307 to route the electromagnetic wave to the head portion 308. Further, the head portion may include a number of output coupling portions 309 corresponding to the number of routing waveguides 307.

In the example of FIG. 3, the footprint portion 305 of the transition housing 300 extends over a smaller area than the head portion 308 of the transition housing 300. This may be particularly advantageous, as the transition housing 300 takes up a small surface area of the substrate 205, allowing for the design of smaller circuits on the substrate, smaller substrates or the incorporation of more electronic components onto the same size substrate. Providing a larger surface area of the transition housing 300 at the head portion 308 allows for the connection of, for example, standard waveguide components such as WR10 waveguides or standard antenna components to the head portion 308 while providing a smaller footprint portion 305. Thus, the size of the footprint portion 305 for coupling to the footprint region on the substrate may be independent of the size of the one or more output coupling portions on the second surface 311.

In one or more examples, the first surface 310 may comprise a different cross-sectional shape compared to the second surface 311. For example, the cross-sectional shape of the footprint portion 305 may be designed in order to provide a minimal footprint region 203 on the substrate by having a design that allows for sufficient footprint portion fixings to allow for coupling to the substrate and enough space for a required number of input coupling portions 306.

In the example of FIG. 3, a substantially triangular shape is provided, however, other designs may be possible. The upper cross-sectional shape may be any suitable shape for providing coupling to one or more output waveguides or antennas. In the example of FIG. 3, the second surface 311 comprises a circular cross-section, however, it will be appreciated that waveguide connectors may have a number of possible shapes, such as rectangles, squares or other shapes. The waveguide/antenna connectors may have standardised shapes and/or sizes and therefore the second surface 311 can be designed to accommodate such standardised connectors independent of the size/shape of the footprint portion 305.

The footprint portion 305 of the transition housing 300 may comprise one or more transition housing footprint portion fixings 312 which are configured to provide for coupling to corresponding substrate fixings 204. The transition housing footprint portion fixings 312 may comprise protrusions which extend from the transition housing 300 through substrate fixings 204 that comprise apertures provided in the substrate for coupling therewith. Such protrusions may be configured to be adhered to the substrate, such as by solder or another adhesive. Alternatively, the protrusions may comprise snap-fit protrusions which include a latch that physically engages with the substrate, after insertion into an aperture, to resist an attempt to remove it therefrom. It will be understood that, alternatively, any protrusions described as being on the transition housing 300 with corresponding apertures in the substrate may also be arranged such that the apertures are in the transition housing 300 and the protrusions are on the substrate. In another example, the both the transition housing footprint fixing 312 and the substrate coupling portion may both comprise apertures through which another coupling member may provide for coupling between the transition housing 300 and the substrate. The coupling member may comprise a bolt or a dual ended snap-fit member.

The head portion 308 of the transition housing 300 may comprise one or more transition housing head portion fixing 314 which are configured to allow for coupling to a corresponding one or plurality of output waveguides or output antennas. The transition housing head portion fixings 314 may comprise any such coupling members for coupling the transition housing to an output waveguide or output antenna as described above in relation to coupling the transition housing to the substrate.

The transition housing 300 may be of metal. The transition housing may be of a non-metallic material and may be coated, at least in part, with a conductive and/or metallic layer, such as within the routing waveguide(s) 307.

Figure 4A:
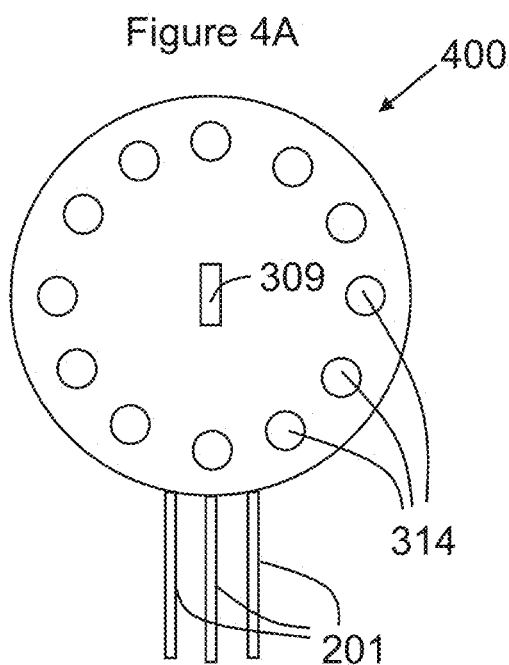
FIGS. 4A and 4B show example embodiments of a plan view of a transmission line coupling system having a single output coupling portion.
Figure 4B:
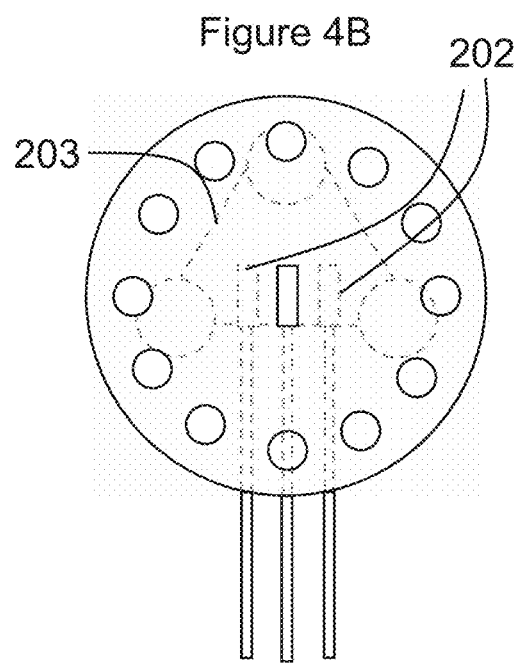

FIGS. 4A and 4B show a plan view of a transmission line coupling system 400. FIG. 4A shows the second surface 311 with the transition housing mounted on a substrate while FIG. 4B includes dashed lines to show the structure of the transmission lines 201 and transition housing beneath the second surface 311. Transition housing head portion fixings 314 extend around the outer edge of the second surface 311 of the transition housing 300 which may be couplable to corresponding output component fixings on an output waveguide or output antenna system. As shown in FIG. 4A, a single output coupling portion 309 is provided which may be coupled, for example, to an output waveguide which extends into a power meter or another test system. Transition housings 300 having a single output coupling portion 309 may also be used for purposes other than coupling to test systems. In this example, the terminal radiating end 202 of the central transmission line 201 couples to a routing waveguide 307 of the transition housing 300 and extends to the output coupling portion 309, although in other examples the transition housing may comprise a routing waveguide 307 for any one or more of the terminal radiating ends 202.

The dotted lines of FIG. 4B show the footprint region 203 and portions of the transmission lines 201 of the transmission line coupling system 400 which extend underneath the transition housing 300. The two terminal radiating ends 202 which are not coupled to routing waveguides can be seen in dotted lines which couple to input coupling portions 306 of the transition housing 300. In this example, the footprint region 203, over which the footprint portion 305 of the transition housing 300 extends, has a smaller cross-sectional area than that of the head portion 308 of the transition housing 300. The body portion 313 of the transition housing 300 may comprise the same cross-sectional area and shape as the head portion 308 or footprint portion 305, or it may comprise one or more different cross-sectional shapes or areas as it extends towards the head portion 308. For example, the body portion 313 may continuously vary from the shape and cross-sectional area of the footprint portion 305 toward the head portion 308.

Figure 5A:
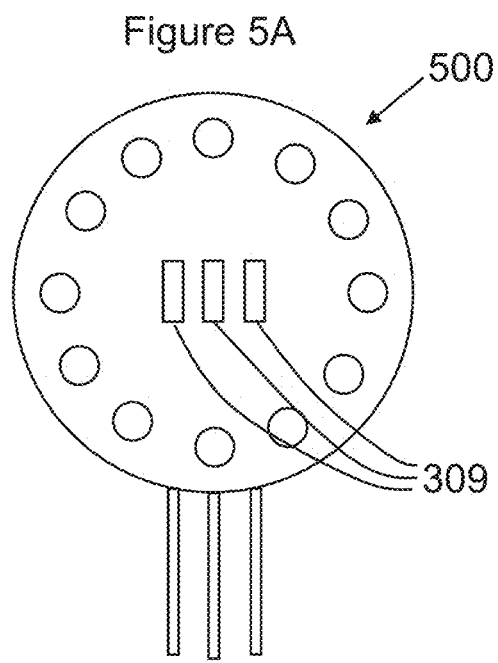
FIGS. 5A and 5B show example embodiments of a plan view of a transmission line coupling system having three output coupling portions.
Figure 5B:
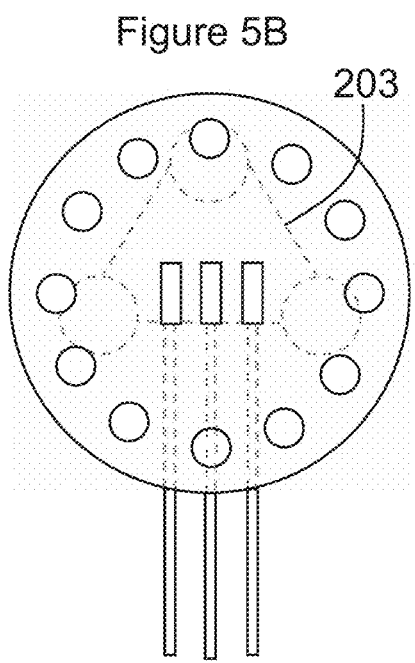

FIG. 5A shows a similar plan view of a transmission line coupling system 500 to FIG. 4A but comprising a transition housing 300 with three output coupling portions 309 instead of one. The dotted lines of FIG. 5B, analogously to FIG. 4B, show the footprint region 203 and portions of the transmission line coupling system 500 which extend underneath the transition housing 300. Each of the terminal radiating ends 202 of the transmission lines 201 in the example of FIGS. 5A and 5B are coupled to respective input coupling portions 306 of the transition housings 300 which, themselves, couple to respective routing waveguides 307 which route electromagnetic waves generated by the terminal radiating ends 202 to respective output coupling portions 309 of the transition housing 300. The head portion 308 of FIGS. 5A and 5B is configured to receive a single output waveguide or output antenna system for receiving electromagnetic waves from the three output coupling portions 309. In other examples, the plurality (three in this example) of routing waveguides 307 may extend to a plurality of separate output coupling portions 309 on the head portion 308.

FIG. 6 shows an electronic device 600 comprising a transmission line coupling system 400, 500 of FIGS. 4A and 4B or 5A and 5B. The electronic device 600 may be any device that requires the coupling of electromagnetic waves from a circuit on a substrate to an output, such as an output waveguide or output antenna. For example, the electronic device 600 may comprise: a mobile communications device; a personal computer; a tablet computer; an automotive radar system; a power meter; a wireless controller; or a magnetic resonance spectrometer.

In the above examples, the transition housing may provide for a reduced use of substrate area and be more compact. Such a transition housing may allow for the use of a WR10 waveguide rather than WR12 and may therefore improve the bandwidth performance.

FIG. 7 shows an example method 700 of connecting a plurality of transmission lines to a plurality of respective output waveguides or output antennas. In the example of FIG. 7, the method comprises the step of providing 701 a transmission line coupling arrangement such as that disclosed in FIG. 2 with a plurality of transmission lines extending to terminal radiating portions within a footprint region for receiving a single transition housing. A second step comprises coupling 702 the terminal radiating ends 202 of the transmission lines 201 of the transmission line coupling arrangement 200 to a transition housing 300 such as that disclosed in FIG. 3 by coupling the input coupling portions 306 of the transition housing 300 to the corresponding terminal radiating ends 202. As disclosed above, the transition housing 300 may comprise a plurality of routing waveguides 307 connected to respective output coupling portions 309 and input coupling portions 703. A further step may comprise coupling a plurality of output waveguides or output antennas to the output coupling portions 309 of the transition housing.

Before the step of coupling the terminal radiating ends 202 of the transmission lines 201 to the transition housing 300, the method may comprise the step of selecting an appropriate transition housing 300 from a plurality of transition housings. An appropriate transition housing 300 may comprise a transition housing 300 with a sufficient number of input coupling portions 306 for connecting to the required number of terminal radiating portions 202, routing waveguides 307, and having the appropriate number of output coupling portions 309 for the desired function of the device. For example, connection to a power meter may require a transition housing 300 with three input coupling portions 306 but only a single output coupling portion 309 for coupling to the power meter.

The transition housings 300 may be advantageously interchangeable such that, for example, three different transition housings each with a single output coupling portion 309 connectable to a different one of three available terminal radiating ends 202. This way, each of the terminal radiating ends 202 may be tested without requiring three individual footprint regions receiving three different transition housings over a large portion of the substrate. After testing each of the terminal radiating ends 202, a transition housing 300 may be provided which is configured to couple to each of the terminal radiating ends 202 and couple these to three respective output antennas for use in a device. It will be understood that any number of terminal radiating ends 202 and corresponding output coupling portions 309 may be provided and coupled together. The transition housings 300 and footprint regions 203 of this disclosure may, therefore, provide for advantageous interchangeable transition housings, thereby providing for flexibility in circuit design while reducing the PCB substrate area required for coupling to a plurality of transmission lines.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A transmission line coupling arrangement comprising:
   a substrate comprising:
      a plurality of transmission lines each having a terminal radiating end for providing an electromagnetic wave as a result of a signal provided to the transmission line; and
      a footprint region extending over a portion of the substrate,
   wherein each of the terminal radiating ends of each of the plurality of transmission lines extends to a respective point within the footprint region; and
   the footprint region configured to receive a single transition housing thereover, the transition housing having at least one waveguide for receipt of the electromagnetic wave from one of the terminal radiating ends for coupling the at least one of the plurality of transmission lines to one of an output waveguide and an output antenna.

2. The transmission line coupling arrangement of claim 1 further comprising a signal generator configured to provide signals to one or more of the plurality of transmission lines, the transmission lines extending substantially parallel to each other over at least a majority of their length.

3. The transmission line coupling arrangement of claim 2 wherein the plurality of transmission lines extend substantially parallel to each other continuously from the radiating ends over at least a majority of their length.

4. The transmission line coupling arrangement of claim 1 wherein the terminating ends terminate at collinear spaced positions within the footprint region.

5. The transmission line coupling arrangement of claim 1, wherein the substrate includes one or more spacing apertures, the one or more spacing apertures extending at least between two of the terminal radiating ends of the plurality of transmission lines.

6. The transmission line coupling arrangement of claim 5, wherein a plurality of the spacing apertures substantially surround the at least one terminal radiating end on each side not in communication with its respective transmission line.

7. The transmission line coupling arrangement of claim 6, wherein the plurality of spacing apertures substantially surround each of the terminal radiating ends on each side not in communication with the respective transmission lines.

8. The transmission line coupling arrangement of claim 1, wherein the footprint region comprises at least one substrate fixing for alignment and coupling to a corresponding footprint portion fixing of the single transition housing to retain the transition housing on the substrate.

9. The transmission line coupling arrangement of claim 1 wherein the plurality of transmission lines is a plurality of microstrip transmission lines.

10. The transmission line coupling arrangement of claim 1 wherein the substrate is a printed circuit board.

11. A transition housing for receipt over a footprint region of a substrate, the transition housing comprising:
   an output coupling portion couplable to an output antenna or an output waveguide;
   a plurality of input coupling portions couplable to a corresponding plurality of terminal radiating ends of a plurality of transmission lines on a substrate; and
   a routing waveguide for routing an electromagnetic wave between one of the plurality of input coupling portions and the output coupling portion.

12. The transition housing of claim 11, wherein the transition housing comprises:
a first surface for abutment and connection to the footprint region and comprising the plurality of input coupling portions; and
a second surface comprising the output coupling portion, wherein the first surface is opposite the second surface.

13. The transition housing of claim 12, wherein the first surface comprises a first surface area and the second surface comprises a second surface area and wherein the first surface area is smaller than the second surface area.

14. The transition housing of claim 11, wherein the transition housing comprises at least one footprint portion fixing for alignment and coupling to a corresponding substrate fixing of the substrate to retain the housing on the substrate.

15. The transition housing of claim 11, wherein the transition housing comprises at least one transition housing head portion fixing for alignment and coupling to a corresponding output fixing of one of an output waveguide and output antenna.

16. The transition housing of claim 12, wherein the geometric shape of the first surface is different than the geometric shape of the second surface.

17. The transition housing of claim 11, wherein the transition housing comprises a plurality of output coupling portions and a plurality of routing waveguides, each of the plurality of routing waveguides associated with a corresponding input coupling portion and output coupling portion to provide routing of electromagnetic waves therebetween.

18. An electronic device comprising a transmission line coupling system, the transmission line coupling system comprising:
a transmission line coupling arrangement comprising:
a substrate comprising:
a plurality of transmission lines each having a terminal radiating end for providing an electromagnetic wave as a result of a signal provided to the transmission line; and
a footprint region extending over a portion of the substrate,
wherein each of the terminal radiating ends of each of the plurality of transmission lines extends to a respective point within the footprint region; and
the footprint region configured to receive a single transition housing thereover, the transition housing having at least one waveguide for receipt of the electromagnetic wave from one of the terminal radiating ends for coupling the at least one of the plurality of transmission lines to one of an output waveguide and an output antenna; and
a transition housing for receipt over a footprint region of a substrate, the transition housing comprising:
an output coupling portion couplable to an output antenna or an output waveguide;
a plurality of input coupling portions couplable to a corresponding plurality of terminal radiating ends of a plurality of transmission lines on a substrate; and
a routing waveguide for routing an electromagnetic wave between one of the plurality of input coupling portions and the output coupling portion.

19. The electronic device of claim 18, wherein the transition housing is received over the footprint region, and each of the plurality of input coupling portions are coupled to each of the corresponding plurality of terminal radiating ends of each of the plurality of transmission lines.

20. The electronic device of claim 18, wherein the electronic device comprises one of: an automotive radar system; a mobile communications device; a navigation device; a power meter; a remote control for a wireless device; and a magnetic resonance spectrometer.

* * * * *